United States Patent
Delamare et al.

(10) Patent No.: US 11,283,372 B2
(45) Date of Patent: Mar. 22, 2022

(54) GENERATOR OF ELECTRICITY COMPRISING A MAGNETO-ELECTRIC CONVERTER AND ASSOCIATED MANUFACTURING PROCESS

(71) Applicant: Enerbee, Grenoble (FR)

(72) Inventors: Jérôme Delamare, Grenoble (FR); Thibault Ricart, Seyssinet Pariset (FR); Jérémie Guillen, Grenoble (FR); Maxime Vincent, Grenoble (FR)

(73) Assignee: Enerbee, Grenoble (FR)

( * ) Notice: Subject to any disclaimer, the term of this patent is extended or adjusted under 35 U.S.C. 154(b) by 771 days.

(21) Appl. No.: 16/093,929

(22) PCT Filed: Apr. 14, 2017

(86) PCT No.: PCT/FR2017/050904
§ 371 (c)(1),
(2) Date: Oct. 15, 2018

(87) PCT Pub. No.: WO2017/178772
PCT Pub. Date: Oct. 19, 2017

(65) Prior Publication Data
US 2019/0089269 A1  Mar. 21, 2019

(30) Foreign Application Priority Data
Apr. 15, 2016 (FR) .................................. 1653357

(51) Int. Cl.
*H01L 41/12* (2006.01)
*H02N 2/18* (2006.01)
*H01L 41/47* (2013.01)
*H01L 41/00* (2013.01)
*H01L 41/16* (2006.01)
*F03G 7/06* (2006.01)

(52) U.S. Cl.
CPC ............... *H02N 2/18* (2013.01); *F03G 7/065* (2013.01); *H01L 41/00* (2013.01); *H01L 41/125* (2013.01); *H01L 41/16* (2013.01); *H01L 41/47* (2013.01)

(58) Field of Classification Search
CPC .......... H02N 2/18; H01L 41/12; H01L 41/125
See application file for complete search history.

(56) References Cited

U.S. PATENT DOCUMENTS

| 9,091,251 | B1 | 7/2015 | Ullakko et al. |
| 2004/0126620 | A1 | 7/2004 | Viehland et al. |
| 2012/0267735 | A1* | 10/2012 | Atulasimha ............. G11C 11/16 257/421 |

FOREIGN PATENT DOCUMENTS

| CN | 103117676 | 6/2016 |
| JP | 2009-535695 A | 10/2009 |

(Continued)

OTHER PUBLICATIONS

Japanese Official Notice of Rejection for Japanese Patent Application No. 2019-505292 dated Feb. 2, 2021, 7 pages.

(Continued)

*Primary Examiner* — Derek J Rosenau
(74) *Attorney, Agent, or Firm* — TraskBritt (57) ABSTRACT

An electrical generator comprises a converter including two electrical terminals for converting a variation in a magnetic field into a potential difference between the terminals. The generator includes a stack of a first layer comprising an anisotropic magnetostrictive material defining a reference plane and a second layer comprising a piezoelectric material. The first layer has at least one preferential axis of deformation in the reference plane and the second layer has a polarization axis parallel to the reference plane, the preferential axis of deformation of the first layer being aligned to within 15° with the polarization axis of the second layer. The (Continued)

generator includes a source that generates the magnetic field, the strength of which is insufficient to magnetically saturate the material of the first layer. The source and converter are able to rotate with respect to each other so as to vary the orientation of the magnetic field.

17 Claims, 6 Drawing Sheets

(56) References Cited

FOREIGN PATENT DOCUMENTS

| WO | 2015/059421 A1 | 4/2015 |
| WO | 2015/059422 A1 | 4/2015 |

OTHER PUBLICATIONS

Lafont et al., Magnetostrictive-Piezoelectric Composite Structures for Energy Harvesting, J. Micromech. Microeng., vol. 22, (2012), pp. 1-6.
International Written Opinion for International Application No. PCT/FR2017/050904 dated Aug. 8, 2017, 6 pages.
International Search Report for International Application No. PCT/FR2017/050904 dated Aug. 8, 2017, 2 pages.
European Communication pursuant to Article 94(3) EPC for European Application No. 17722491, dated Sep. 12, 2019, 5 pages.

* cited by examiner

GENERATOR OF ELECTRICITY COMPRISING A MAGNETO-ELECTRIC CONVERTER AND ASSOCIATED MANUFACTURING PROCESS

CROSS-REFERENCE TO RELATED APPLICATIONS

This application is a national phase entry under 35 U.S.C. § 371 of International Patent Application PCT/FR2017/050904, filed Apr. 14, 2017, designating the United States of America and published in French as International Patent Publication WO 2017/178772 A1 on Oct. 19, 2017, which claims the benefit under Article 8 of the Patent Cooperation Treaty to French Patent Application Serial No. 1653357, filed Apr. 15, 2016.

TECHNICAL FIELD

This disclosure relates to the field of energy recovery devices. It concerns, in particular, an electricity generator and a converter capable of converting a variation in magnetic energy into an electrical potential difference, in addition to an associated manufacturing method. The magneto-electric converter comprises a stack of layers of magnetostrictive and piezoelectric materials.

BACKGROUND

Magnetostriction generally involves a reversible exchange of energy between a mechanical form and a magnetic form. The best known magnetostriction effect is the Joule effect. It corresponds to expansion, in the case of a positive magnetostriction coefficient, or to contraction, in the case of a negative coefficient, of a ferromagnetic rod under the influence of a magnetic field. In the absence of a magnetic field, the bar theoretically returns to its original form. In the case of longitudinal expansion in the direction of the magnetic field, a contraction appears in the transverse directions so as to maintain the volume of the bar substantially constant.

When the magnetic field lines magnetically saturate the block of magnetostrictive material, deformation is at its maximum along an axis parallel to these field lines, regardless of whether the material is isotropic or anisotropic. When a block of anisotropic magnetostrictive material is not magnetically saturated, it has a preferential axis of deformation which is an intrinsic property of the block, depending on the crystal orientation of the material. Preferential axis of deformation denotes the axis along which the amplitude of deformation is at its maximum in the presence of a magnetic field parallel to this axis. The terms "preferential axis of deformation" and "preferential axis of magnetization" denote the same axis and will, therefore, be used interchangeably throughout this text.

Piezoelectricity is the generation of electrical charges under the influence of mechanical stress. Among piezoelectric materials, PZT (lead zirconate titanate) is known. PZT, equipped with two electrodes, can be prepolarized, by means of heat treatment at a temperature slightly lower than its Curie temperature, during which a voltage is applied to the electrodes. The polarization axis of the material is established in this case in a direction from one electrode to the other. This polarization determines, in particular, the electrode on which an excess of electrical charges will appear in response to stress applied to the piezoelectric material. Considering a layer of PZT material, comprising a parallel upper and lower face, the polarization axis can be oriented in a direction perpendicular to the faces owing to the presence of an electrode on each face. Alternatively, the polarization axis can be oriented in a direction parallel to the faces, using interdigitated electrodes on at least one of the two faces of the layer. In the latter case, the polarization axis is parallel to the plane of the faces and perpendicular to the fingers of conductive material forming the interdigitated electrodes. In order to convert a stress/deformation into an electrical potential difference at the electrode terminals, one of two particular modes can, therefore, be adopted depending on whether the strain is perpendicular to the polarization axis (mode known as $d_{31}$) or whether the strain is parallel to the polarization axis (mode known as $d_{33}$).

Electricity generators are known from the state of the art (article by T. Lafont et al., "Magnetostrictive-piezoelectric composite structures for energy harvesting," Journal of Micromechanics and Microengineering, no. 22, 2012) comprising a magnetic field source, the field lines of which are parallel to a reference plane and a magnetoelectric converter capable of converting a variation in the magnetic field into an electrical potential difference between two electrical terminals. The converter consists, on the one hand, of an electromechanical transducer comprising a piezoelectric layer capable of transforming a mechanical deformation into an electrical potential difference between two electrical terminals connected to its electrodes. The converter is also composed of a magnetostrictive layer fixed according to the reference plane and without a degree of freedom to the electromechanical transducer, capable of converting a variation in the magnetic field into a mechanical deformation, applied to the electromechanical transducer.

In the case of a permanent magnet with a rotational movement above the converter (allowing variation of the orientation of the magnetic field in the reference plane), this document recommends use of an isotropic magnetostrictive material and, in particular, FeSiB (an alloy based on iron, silicon and boron). In this case, the preferential axis of deformation of the magnetostrictive layer follows the orientation of the magnetic field in the reference plane and does not provide any opposing torque in reaction to rotation of the magnet.

However, this material has a very low magnetostrictive coefficient, which leads to a low conversion efficiency of the converter. The conversion efficiency of the converter is defined as the amount of electrical energy generated (i.e., the difference in potential between the two electrical terminals) in relation to a given variation in the energy to be recovered (variation in the magnetic field).

The known materials with higher magnetostrictive coefficients are anisotropic (for example, Terfenol with a composition TbDyFe, an alloy of iron and rare earths). Electricity generators using this type of material are known from the state of the art, in particular, WO 2015/059421 and WO 2015/059422.

These magnetostrictive materials require a sufficiently strong magnetic field in order to be saturated and thus function in an isotropic deformation domain. The large size of the magnetic field source no longer makes it possible to maintain the compactness of the generator.

AIM OF THE INVENTION

A purpose of the disclosure is to offer a device and a method remedying all or some of the disadvantages of the prior art. One of the aims of the disclosure is specifically to offer an efficient magnetoelectric converter within a compact electrical generator. In other words, the disclosure aims to reduce the overall dimensions of a generator keeping constant the efficiency or, with constant overall dimensions, increase the efficiency of the generator.

BRIEF SUMMARY

In some embodiments, the present disclosure relates to an electricity generator comprising:
- a converter comprising two electrical terminals, capable of converting a variation in a magnetic field into an electrical potential difference between the two electrical terminals and including a stack of a first layer of anisotropic magnetostrictive material defining a reference plane and a second layer of piezoelectric material, wherein the first layer has at least one preferential axis of deformation in the reference plane and the second layer has a polarization axis in the plane defined by the second layer, parallel to the reference plane; the preferential axis of deformation of the first layer being aligned to within 15° with the polarization axis of the second layer;
- a source generating the magnetic field in the reference plane, the strength of which is insufficient to magnetically saturate the material of the first layer;

The magnetic field source and the converter of the generator according to the disclosure can rotate in relation to each other so as to vary the orientation of the magnetic field in the reference plane.

The magnetic field source can be small, as the generator according to the disclosure does not require the high field strengths necessary to saturate the anisotropic magnetostrictive material; thus the generator can fulfill the need for compactness. The first layer of magnetostrictive material is selected from among anisotropic materials that have high magnetostrictive coefficients, thus encouraging conversion sensitivity. The conversion sensitivity is maximized by controlled alignment of the preferential axis of deformation of the first layer with the polarization axis of the second layer. Maximum deformation (in the presence of a magnetic field parallel to the preferential axis of deformation of the first layer) will be transmitted to the second piezoelectric layer along its polarization axis (aligned to within 15° with the preferential axis of deformation), i.e., in a highly efficient configuration for generating charges. The generator according to the disclosure thus provides advantages both in terms of compactness and conversion efficiency.

According to advantageous characteristics of the disclosure, taken either separately or in combination:
- the magnetic field source defines a housing within which the magnetic field prevails, with the converter being located in the housing;
- the magnetic field source is a Halbach cylinder;

This configuration of the magnetic field source allows a small generator size.

The disclosure also relates to a layer of anisotropic magnetostrictive material comprising at least one preferential axis of deformation in the plane defined by the layer, remarkable in that the layer has at least one mark or is provided with at least one marking means, identifying a preferential axis of deformation.

The alignment to within 15° between the preferential axis of deformation of the first layer and the polarization axis of the second layer, required to form an efficient generator, is made possible by the layer of magnetostrictive material according to the disclosure: indeed, this layer includes the marking means required for implementing this controlled alignment.

According to advantageous characteristics of the disclosure, taken either separately or in combination:
- the mark is a flat or a notch on one edge of the layer or an engraving on one face of the layer;
- the layer of anisotropic magnetostrictive material comprises two preferential axis of deformation, a main axis and a secondary axis, with the mark or marking means identifying the main axis;

In additional embodiments, the present disclosure also relates to a stack of layers comprising:
- A first layer of a magnetostrictive material as described above;
- A second layer of a piezoelectric material having a first polarization axis in the plane defined by the second layer parallel to the plane defined by the first layer, with the first polarization axis being identified by a second mark;

The first polarization axis and the preferential axis of deformation are aligned to within 15°.

According to advantageous characteristics of the disclosure, taken either separately or in combination:
- the stack of layers comprises a bonding layer between the first layer and the second layer;
- the second layer comprises metal electrodes on at least one of its faces or on its side edge;
- The first polarization axis and the preferential axis of deformation are aligned to within 5°;
- the stack of layers comprises a third layer of a piezoelectric material having a second polarization axis in the plane defined by the third layer, with the first layer being arranged between the second layer and the third layer and with the second polarization axis and the preferential axis of deformation being aligned to within 15°;
- the first layer of a magnetostrictive material comprises a main axis of deformation and a secondary axis of deformation in the plane defined by the layer;
- the first polarization axis of the second layer of piezoelectric material is aligned with the main axis of deformation to within 15°;
- the second polarization axis of the third layer of piezoelectric material is aligned with the secondary axis of deformation to within 15°;
- the piezoelectric material is composed of PZT, PMN-PT, PVDF, $BaTiO_3$ or AlN;
- the magnetostrictive material is composed of Terfenol-D, Galfenol, Terbium Iron or Iron-Cobalt.

In yet further embodiments, the disclosure also relates to a converter capable of converting a variation in a magnetic field into an electrical potential difference between two electrical terminals comprising a stack of layers as described above.

According to advantageous characteristics of the disclosure, taken either separately or in combination, the converter comprises:
- two electrical terminals;
- a printed circuit layer assembled with the stack of layers, for connecting the at least one layer of piezoelectric material of the stack to both electrical terminals;
- a buffer layer, the material of which has sound absorbing properties, arranged between the stack and the printed circuit layer.

The disclosure also relates to a method for treating a layer made of an anisotropic magnetostrictive material, remarkable in that it comprises:
- a stage of identifying a preferential axis of deformation in the reference plane defined by the layer; and
- a stage of forming a mark on the layer to identify the preferential axis of deformation.

According to advantageous characteristics of the disclosure, the stage of identifying the preferential axis of deformation involves:
- positioning the layer in a magnetic field oriented in the reference plane;
- measuring the torques required to rotate the layer in the reference plane, in a plurality of angular positions; and
- determining at least one angular position corresponding to an extremum of torque, in order to identify a preferential axis of deformation.

The disclosure also relates to a method of manufacturing a stack of layers, comprising:
- a stage of providing a first layer of anisotropic magnetostrictive material;
- a stage of identifying at last one preferential axis of deformation in the reference plane defined by the first layer;
- a stage of providing a second layer of a piezoelectric material having a first polarization axis in a plane defined by the second layer and identified by a second mark;
- a stage of aligning the preferential axis of deformation of the first layer with the first polarization axis of the second layer;
- a stage of assembling the first layer with the second layer to form the stack of layers.

According to advantageous characteristics of the disclosure, taken either separately or in combination:
- the method of manufacture of a stack of layers comprises:
  - a stage of providing a third layer of a piezoelectric material having a second polarization axis in a plane defined by the third layer and identified by a third mark;
  - a stage of aligning the preferential axis of deformation of the first layer with the second polarization axis of the third layer; and
  - a stage of assembling the first layer with the third layer, with the first layer being arranged between the second layer and the third layer.
- The second and third layers of a piezoelectric material each have metal electrodes on at least one of their faces; and
- the assembly stages comprise depositing adhesive on at least one of the faces of the layers to be joined and placing the faces in contact with one another.

The disclosure finally relates to a method of assembling an electricity generator comprising:
- manufacturing a stack of layers, with the first layer defining a reference plane;
- assembling the stack of layers with a printed circuit layer, in order to connect the at least one layer of piezoelectric material to two electrical terminals and form the magnetoelectric converter; and
- placing the converter in a housing defined by a magnetic field source, in which a field prevails, with part of the field lines being included in the reference plane.

BRIEF DESCRIPTION OF THE DRAWINGS

Further characteristics and advantages of the disclosure will be clear from the following detailed description of embodiments of the disclosure, made in reference to the appended figures, in which.

DETAILED DESCRIPTION

Figure 1:
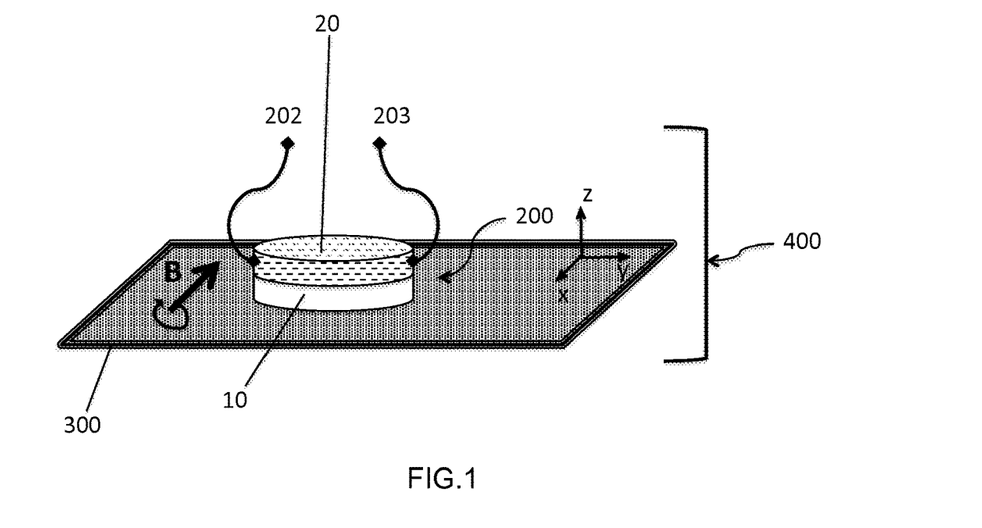
FIG. 1 shows a block diagram of an electricity generator according to the disclosure.

FIG. 1 illustrates a block diagram of an electricity generator 400 according to the disclosure. The electricity generator 400 comprises a magnetic field source 300 and a magnetoelectric converter 200 capable of converting a variation in the magnetic field B into an electrical potential difference between electrical terminals. The converter 200 comprises two electrical terminals 202, 203 and a stack of layers 100 comprising a first layer 10 of magnetostrictive material defining a reference plane (x, y) and a second layer 20 of piezoelectric material. Part of the lines of the magnetic field B is parallel to the reference plane (x, y). The magnetic field source 300 and the converter 200 can rotate in relation to each other so as to vary the orientation of the magnetic field B in the reference plane.

According to the disclosure, in order to limit the overall dimensions of the generator 400 (e.g., on the order of one cubic centimeter), the size of the magnetic field source 300 is reduced, thereby generating a magnetic field B, the strength of which is relatively weak, i.e., insufficient to magnetically saturate the material of the layer 10. The field strength may be on the order of 0.3 Tesla, or between 0.1 and 0.6 Tesla. Advantageously, the magnetostrictive material is chosen so as to have a high magnetostrictive coefficient, for example, greater than 100 ppm. The magnetostrictive material may comprise Terfenol, Galfenol, Terbium Iron or even Iron-Cobalt, in their crystalline forms. In an unsaturated magnetization domain, these materials are anisotropic and thus present one or more preferential axis of deformation.

According to an advantageous aspect of the disclosure and to fulfill the requirements for compactness, the source 300 is provided with a housing in which the magnetic field B prevails and in which the converter 200 is located. By way of example, the magnetic field source 300 may be a permanent magnet, such as a Halbach cylinder for example.

In order to improve the conversion efficiency and/or overall dimensions of the generator 400, it is advantageous to take account of the anisotropy characteristic of the magnetostrictive material in unsaturated mode. The generator according to the disclosure is remarkable in that the preferential axis of deformation of the first layer 10 of magnetostrictive material has been aligned with the polarization axis of the second layer 20 of piezoelectric material. In this way, it is ensured that any deformation of the first layer 10, inducing deformation of the second layer 20, results in optimum generation of charges in this second layer 20 and in creation of a maximum electrical potential difference at the terminals 202, 203 of the converter 200. However, the preferential axis of deformation of the first layer 10 is not an element of information that is usually readily available, as shown by the preliminary experiments conducted by the applicant.

Figure 2A:
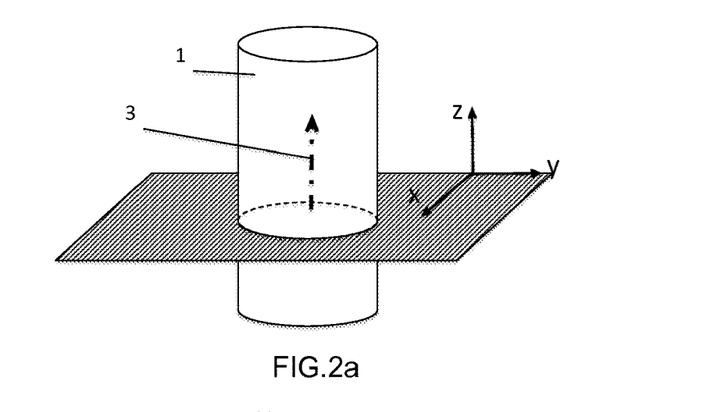
FIGS. 2a and 2b show an example of manufacture of a layer of magnetostrictive material.
Figure 2B:
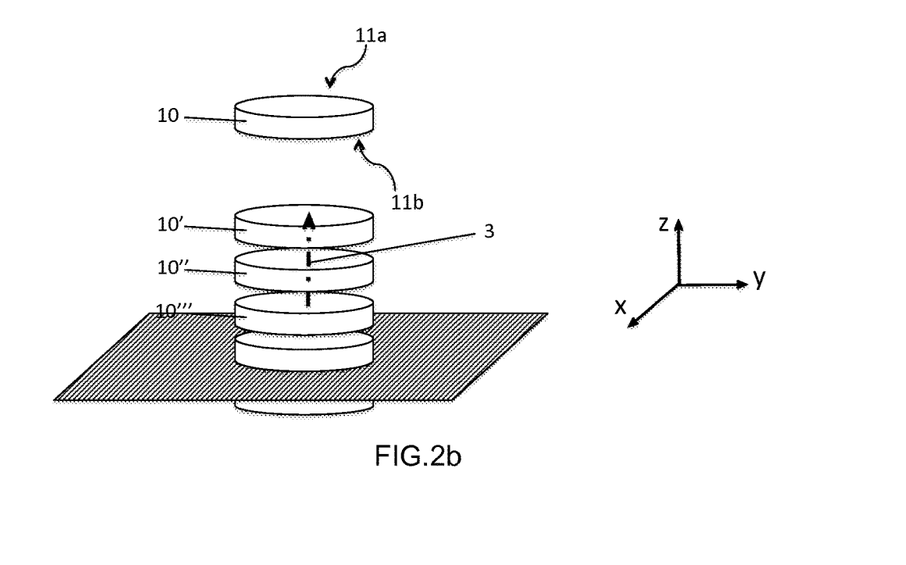

In order to obtain layers 10 of magnetostrictive material, a magnetostrictive material bar 1 is initially formed by a known method, for example, by vertical zone-melting (FSZM for "Free-Stand Zone Melt") or using the "modified Bridgman" method. As illustrated in FIG. 2a, the longitudinal axis 3 of the bar 1 is aligned with the preferential axis of deformation of the bar 1 (which is the axis <112> for Terfenol bars). Conventionally, according to the prior art, layers are formed in a plane parallel to this axis. However, according to one aspect of the disclosure, the layers 10 of magnetostrictive material are preferably made from transversal cuts of the bar 1, as shown in FIG. 2b. A major portion of the bar 1 is used in this manner to create a plurality of layers 10, 10', 10" . . . . Each transversal cut can be processed by lapping, polishing, trimming, edge treatment . . . to provide a layer 10 of the required quality and dimensions. A bar 1 of magnetostrictive material can thus provide a plurality of layers 10, 10', 10", the faces of which 11a, 11b are essentially parallel to a reference plane (x, y). In order to identify the orientation of each of the layers 10, 10', 10" originating from the bar 1, an orientation flat can be formed on the bar 1 along its longitudinal axis, following its formation and before cutting the transversal sections.

Figure 3A:
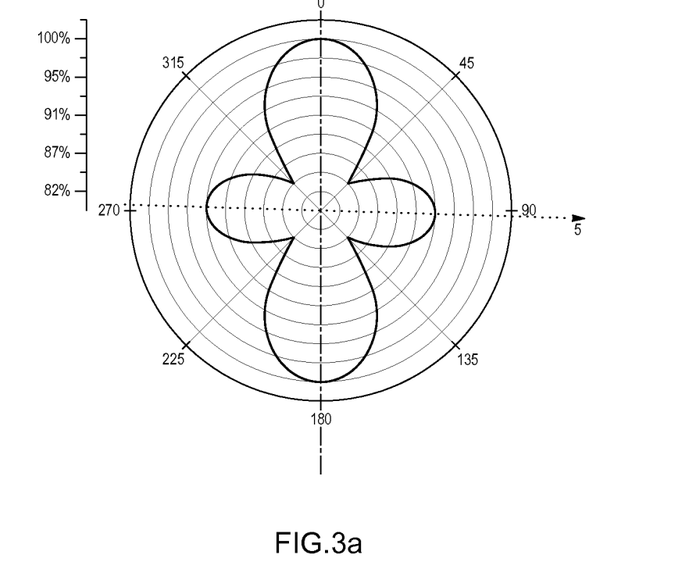
FIG. 3a illustrates mapping of the magnetization in a layer of a magnetostrictive material subjected to a magnetic field of variable direction, as a function of the crystal orientations in the layer.

In order to characterize the layers 10, 10', 10" obtained using this method and illustrate the effect of the anisotropic nature of these layers, the applicant has measured the magnetization levels generated in a layer 10 of Terfenol-D, in different directions corresponding to different angular positions (0° to 360° with respect to the orientation flat), when applying a uniform magnetic field parallel to each direction. The level of magnetization is determined by measuring the voltage generated at the terminals of a coil in which the layer 10 executes a vibratory movement. The strength of the magnetic field was 2 kOe (Kilooersted), which is insufficient to saturate the material magnetically. FIG. 3a shows that two preferential axis of magnetization 4, 5 exist for a layer 10 of Terfenol-D for which the magnetization level is higher in comparison to the other directions. The main axis is the axis 4 and has the maximum magnetization level, higher than that of the secondary axis 5. The main axis 4, in the case of Terfenol-D, is aligned with the crystallographic axis <111>; the secondary axis 5 is aligned with the crystallographic axis <110>. It is also observed that outside the directions of the preferential axis 4, 5, the magnetization level of the Terfenol-D is up to 15%-20% lower.

Figure 3B:
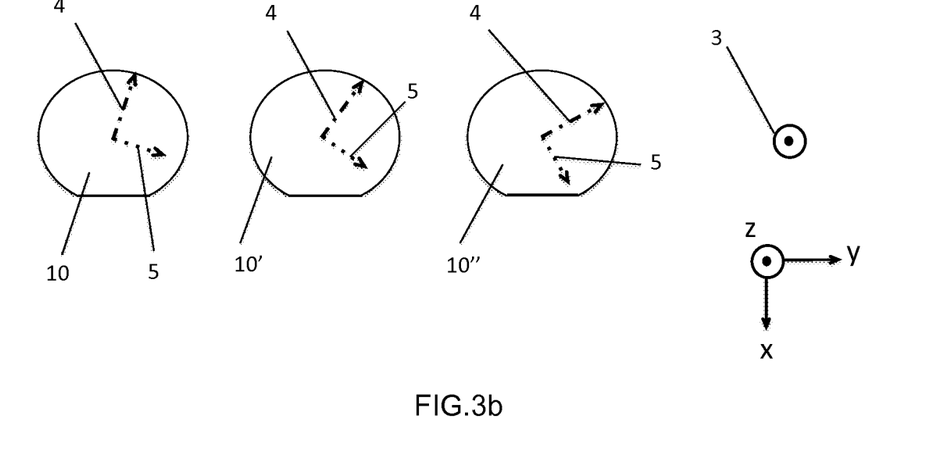
FIG. 3b shows a block diagram of the variability of orientation of a preferential axis of magnetization among several layers of a magnetostrictive material.

By repeating this measurement protocol on a plurality of layers 10, 10', 10" obtained from the same Terfenol bar 1, the applicant has observed that the orientations of the preferential axis of magnetization of the layers 10, 10', 10" could vary from one layer to another. This is illustrated in FIG. 3b in which it can be seen that the position of the preferential axis 4, 5 of each of the layers 10, 10', 10" opposite the orientation flat point originally formed on the bar 1 is not identical. Thus, the usual marking techniques, such as creating a flat or a notch on the bar 1, following its growth and prior to cutting the transversal sections, do not make it possible to identify the preferential axis of magnetization of the layers 10, 10', 10".

In order to solve the problem and allow aligned assembly of a layer 10, the disclosure provides for the treatment of the layer 10 of anisotropic magnetostrictive material. This layer 10 may be derived from the transversal cut of a bar 1 of magnetostrictive material, as explained in the previous paragraphs. Treatment initially comprises a stage of identifying at least one preferential axis of magnetization 4, 5 in a reference plane defined by the layer 10 (FIG. 4a), i.e., parallel to the faces 11a and 11b of the layer 10.

Figure 4:
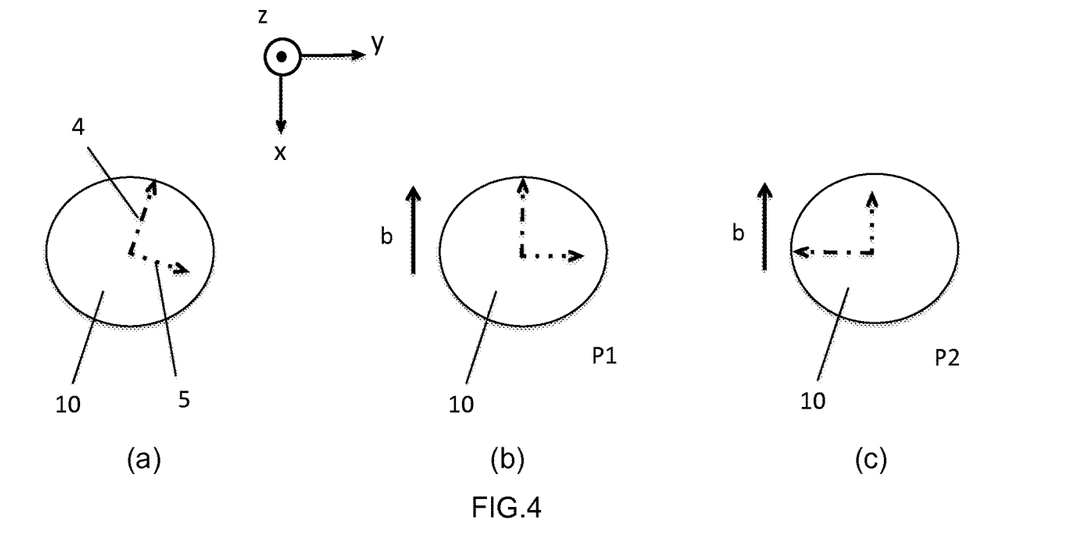
FIGS. 4a to 4c show a method of treating a layer of a magnetostrictive material according to the disclosure.

By way of example, this stage of identifying the preferential axis of magnetization may comprise:

Positioning the layer 10 in a magnetic field b oriented in a given direction in the reference plane. Since the layer 10 has freedom of rotational movement, it will naturally align one of its preferential axis of magnetization 4, 5 with the direction of the magnetic field b, whereby this position corresponds to a first stable position (designated P1 in FIG. 4b);

Measuring the torques required to rotate the layer 10 in the reference plane, in a plurality of successive angular positions. For example, a measurement of the torque required to cause rotational movement of the layer 10 from a first stable position P1 (FIG. 4b) to a second stable position P2 (FIG. 4c) is performed;

Determining at least one angular position corresponding to an extremum of torque, in order to identify a preferential axis of magnetization. The stable positions allow identification of the preferential axis of magnetization. More effort is required to withdraw from the stable position P1 corresponding to the main axis of magnetization 4 than position P2 corresponding to the secondary axis of magnetization 5: this torque difference makes it possible to distinguish the preferential axis when there are several in the plane of the layer 10.

According to a second example, the stage of identifying the preferential axis of magnetization may involve identifying the crystallographic axis of the layer 10, for instance, by X-ray measurement.

According to a third example, the preferential axis of magnetization can be obtained by measuring the magnetization level for each layer 10 in different angular positions by applying the methodology described in FIG. 3a.

Figure 5:
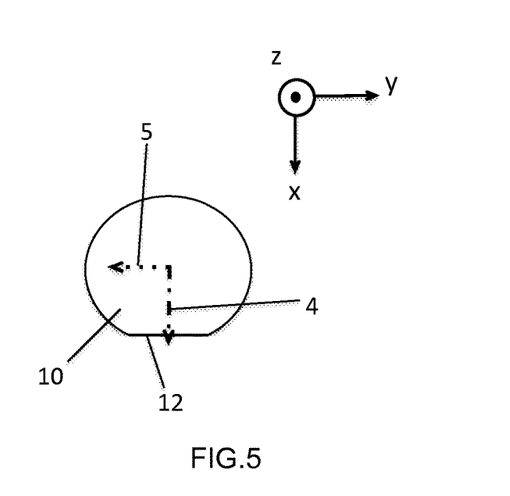
FIG. 5 shows a layer of magnetostrictive material according to the disclosure.

Treatment of the layer 10 may also include a stage of forming a mark 12 on the layer 10 to identify at least one preferential axis of magnetization 4, 5. Advantageously, the main axis of magnetization 4 will be identified by a mark 12 on the edge of the layer, such as, for example, a flat (as shown in FIG. 5), a line, an engraving (performed, for example, (e) by chemical or laser etching) or a notch.

Depending on the case, the mark 12 can be positioned directly on the preferential axis of magnetization of interest or at a determined angular position in relation to this axis (for example, at 90°, 45°, 30° . . . ). In any case, and whatever the form or position of this mark 12, the latter allows identification of a preferential axis of magnetization 4, 5 of the layer 10.

On completion of this treatment, a layer 10 of anisotropic magnetostrictive material is obtained, comprising at least one preferential axis of magnetization 4, 5 in the plane defined by the layer 10 and comprising at least one mark 12 identifying a preferential axis of deformation 4, 5.

Alternatively, the stage of forming a mark 12 can be replaced by implementing a magnetic orientation which will be described in more detail with reference to creation of the stack forming the converter.

As seen in FIG. 1, the converter 200 comprises a stack comprising a first layer 10 of magnetostrictive material and a second layer 20 of piezoelectric material. According to one aspect of the disclosure, for the conversion efficiency reasons already mentioned, a preferential axis of deformation 4, 5 of the first layer 10 is aligned to within 15° with the polarization axis of the second layer 20.

Figure 6:
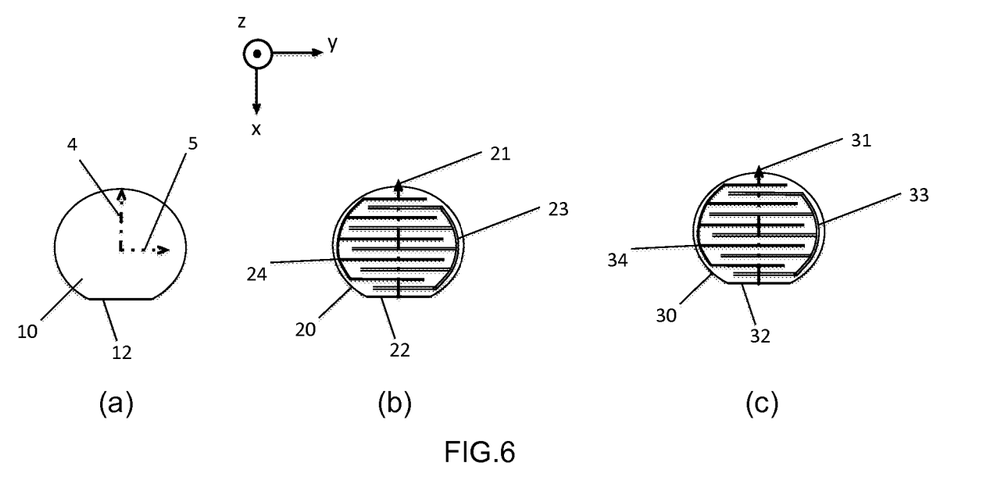
FIGS. 6a to 6c show a layer of a magnetostrictive material and layers of a piezoelectric material used to manufacture a stack of layers according to the disclosure.

The method of manufacture of the stack 100 involves providing a layer 10, comprising at least one mark 12 identifying a preferential axis of deformation 4, 5 (FIG. 6*a*). The method also comprises a stage of providing a second layer 20 of a piezoelectric material having a polarization axis 21 in a plane defined by the second layer 20 (FIG. 6*b*). At least one of the faces of the second layer 20 comprises electrodes, preferably interdigitated electrodes 23, 24. In the latter case, the polarization axis 21 of the second layer 20 is parallel to the plane of the faces of the second layer 20 and perpendicular to the fingers of conductive material forming the interdigitated electrodes 23, 24. The layer 20 of piezoelectric material is, therefore, preferably prepared to operate in $d_{33}$ mode, which is advantageously more sensitive than $d_{31}$ mode, which contributes to improved efficiency of the converter.

According to a first option, the electrodes 23, 24 can be formed by a conductive material in contact with the face of the second layer 20; the plurality of fingers of each electrode can be connected by a semi-circular segment, as illustrated in FIG. 6*b*, in particular, in the case of a circular-shaped second layer 20.

According to a second option, the fingers of each electrode can be connected in pairs by a conductive element, for example, wire bonding, at the face of the second layer 20 or on its side edge: this configuration makes it possible, in particular, to increase the dimension of the fingers (for example, up to the edges of the second layer 20) and, therefore, develop the active part of collection of charges on a larger surface of the face of the second layer 20.

According to a third option, the electrodes 23, 24 can be formed of a conductive material, arranged in the thickness of the second layer 20: each finger of an electrode present on one face of the second layer 20 extends into the thickness thereof, forming a through-blade of conductive material. Reference can be made, for example, to multilayer piezoelectric stack techniques for manufacturing the second layer 20 according to this third option. This configuration maximizes efficiency in collecting charges, as it utilizes the full thickness of the second layer 20. As non-limiting examples, this third option can incorporate either of the modes of connection of the fingers of each electrode described in the first and second options above.

The geometry of the electrodes 23, 24 of the second layer 20 makes it possible to identify the axis of polarization 21 and can constitute a mark (designated second mark 22). Optionally, a flat, line or notch can be formed on the second layer 20, representing the second mark 22, to identify this axis 21. The second mark 22 can also be borne by at least one of the electrodes, providing it a local shape that can be easily identified.

The manufacturing method for the stack of layers 100 includes a stage of aligning a preferential axis of deformation 4, 5 of the first layer 10 (advantageously the main axis 4) with the polarization axis 21 of the second layer 20; this polarization axis 21 will be designated "first polarization axis" for the sake of greater clarity in the remainder of the description. This alignment stage will be performed, in particular, by means of the marks 12 and 22, respectively, present on the first layer 10 and the second layer 20. The marks 12 and 22 will be arranged such that the preferential axis of deformation (in particular, the main axis of deformation 4) is aligned better than 15° with the first polarization axis 21.

Since the preferential axis of deformation 4, 5 and the first polarization axis 21 are contained in substantially parallel planes (respectively, the reference plane defined by the first layer 10 and the plane defined by the second layer 20), the alignment between these two axis involves limiting the angle that they form between each other, in a planar view according to the reference plane. In other words, the angle formed by the projections of these axis on the reference plane is less than 15°, according to the disclosure, owing to the alignment stage. In the remainder of the description, an alignment between the axis "to within α" or "better than α" is to be interpreted as equivalent to an angle less than "α" between the projections of these axis on the reference plane.

Advantageously, the preferential axis of deformation and the polarization axis will be aligned to within 10° or even 5°.

According to one alternative, the stage of aligning the preferential axis of deformation and the polarization axis can be performed by optical alignment between the mark 12 on the layer 10 and the interdigitated fingers of the electrodes 23, 24, since the polarization axis 21 can be identified in relation to the latter: the interdigitated fingers of the electrodes 23, 24 form the second mark 22 in this alternative.

According to another alternative, the stage of aligning the preferential axis of deformation 4, 5 can be based on implementing a magnetic orientation: according to the operating procedure described in relation to FIGS. 4*a* to 4*c*, the layer of magnetostrictive material 10 may be subjected to a magnetic field and left to freely rotate, so that it spontaneously aligns one of its preferential axis of deformation with the magnetic field applied in the plane of the layer. This position can subsequently be maintained, for example, by a device for gripping the layer 10 in order to align the polarization axis of the layer 20 until the next assembly stage. In this alternative, the first mark 12 identifying a preferential axis of deformation is not physically present on the layer 10 and is replaced instead by a marking means comprising the device for gripping the layer 10, before its assembly with the layer 20.

The method for manufacturing the stack of layers 100 comprises a stage of assembling the first layer 10 with the second layer 20. The assembly stage may include, on the one hand, spreading a film or a coil of adhesive 40 on at least one of the two faces to be joined, respectively, that of the first layer 10 or the second layer 20. This spreading stage can be performed prior to the alignment stage, with the alignment stage being carried out so that the faces to be assembled, at least one of which has adhesive on it, do not touch.

Figure 7:
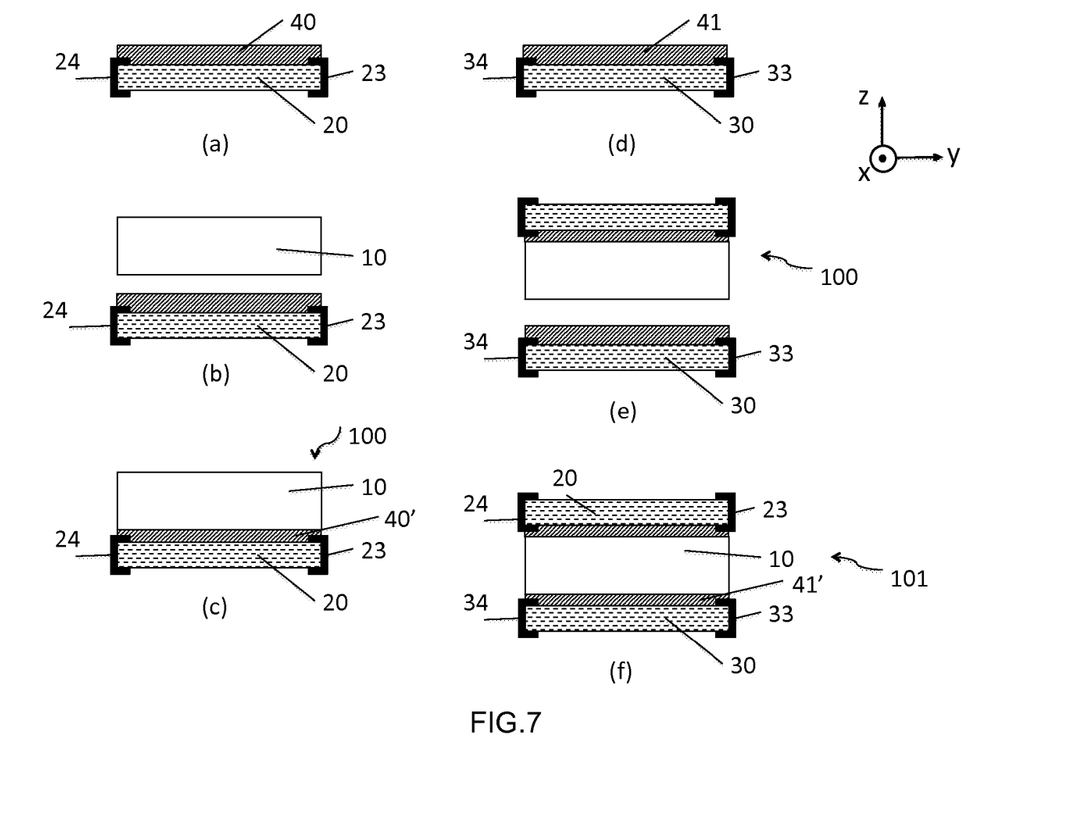
FIGS. 7a to 7f show a method of manufacturing a stack of layers according to the disclosure.

FIGS. 7*a* to 7*f* show such an embodiment: the adhesive film 40 is spread on the second layer 20 (FIG. 7*a*); the first layer 10 is subsequently arranged opposite the second layer 20, so as to align the main axis of deformation 4 better than 15° with the first polarization axis 21 (FIG. 7*b*). In addition, the assembly stage involves placing the faces of the layers 10 and 20 to be assembled in contact with each other (FIG. 7*c*). In order to obtain a uniform layer of adhesive 40' at the interface between the two layers, uniform pressure will be applied so as to bring the two layers closer together, maintaining an alignment between the main axis of deformation 4 and the first polarization axis 21 to within 15°.

The stack of layers 100 thus consists of the first layer 10 of magnetostrictive material joined to the second layer 20 of piezoelectric material, with the latter being equipped with electrodes 23, 24 on at least one of its faces. The stack of layers 100 is remarkable in that the misalignment between a preferential axis of deformation 4, 5 (advantageously the main axis of deformation 4) of the first layer 10 and the first polarization axis 21 of the second layer 20 is less than 15°. Advantageously, this misalignment is even less than 10° or less than 5°.

According to one alternative, the method of manufacturing a stack of layers 101 includes a stage of providing a third layer 30 of a piezoelectric material having a polarization axis 31 in a plane defined by the third layer 30 and optionally identified by a third mark 32 (FIG. 6c). Advantageously, at least one of the faces of the third layer 30 has interdigitated electrodes 33, 34 and the polarization axis 31 is parallel to the plane of the faces and, in particular, perpendicular to the fingers of conductive material forming the interdigitated electrodes 33, 34.

The manufacturing method also includes a stage of aligning a preferential axis of deformation 4, 5 of the first layer 10 (preferably the main axis of deformation 4, but alternatively, the secondary axis of deformation 5) with the polarization axis 31 of the third layer 30. This polarization axis will be designated "second polarization axis" for greater clarity in relation to the first polarization axis of the second layer 20. This alignment stage will be performed, for example, by means of the marks 12 and 32, respectively, present on the first layer 10 and the third layer 30. The marks 12 and 32 will be arranged such that the preferential axis of deformation (in particular, the main axis of deformation 4, or alternatively the secondary axis of deformation 5) is aligned better than 15° with the second polarization axis 31. The other forms of embodiment of the alignment stage described above may of course be used.

The manufacturing method finally comprises a stage of assembling the stack of layers 100 with the third layer 30 such that the first layer 10 is arranged between the second layer 20 and the third layer 30. Assembly is, therefore, performed between the free face of the first layer 10 (opposite face to that joined to the second layer 20) and one of the faces of the third layer 30, after spreading the film or the coil of adhesive 41 and after positioning the marks 12 and 32 to align a preferential axis of deformation 4, 5 and the second polarization axis 31. By way of example, the film of adhesive 41 is applied to a face of the third layer 30 as illustrated in FIG. 7d. The manufacturing method makes it possible to assemble the first layer 10 and third layer 30 such that a preferential axis of deformation 4, 5 is aligned better than 15° with the second polarization axis 31.

Advantageously, this misalignment between these two axis will be even less than 10° or indeed 5°.

The stack of layers 101 thus comprises the first layer 10 of magnetostrictive material arranged between the second layer 20 and the third layer 30 of piezoelectric material, with each being equipped with electrodes 23, 24, 33, 34 on at least one of their faces (FIG. 7f). The stack of layers 101 is remarkable in that a preferential axis of deformation 4, 5 (preferentially the main axis of deformation 4) of the first layer 10 is aligned better than 15° with the first 21 and second 31 polarization axis, of the second layer 20 and third layer 30, respectively.

According to an advantageous form of embodiment of the stack of layers 101 according to the disclosure, a preferential axis of deformation (advantageously the main axis of deformation 4) of the first layer 10 is even aligned to within 2° with the first 21 and second 31 polarization axis of the second layer 20 and third layer 30, respectively.

The adhesive used during the assembly stage may be selected from among different types of material in order to favor certain characteristics of the stack of layers 100, 101. The viscoelastic behavior of some adhesive materials will be advantageous in order to accommodate the differences in thermal expansion between the layers of piezoelectric material 20, 30 and the layer of magnetostrictive material 10. Harder and stiffer adhesive materials are preferred to ensure effective transfer of deformation from the first layer 10 to the second layer 20 and third layer 30. An adhesive interface allowing minimal slip between the layers may alternatively be produced by co-sintering the assembled layers or furthermore by direct bonding, without addition of adhesive material.

In some embodiments, the piezoelectric material may be selected from among PZT, PMN-PT, PVDF, $BaTiO_3$ or AlN.

The magnetoelectric converter 200 according to the disclosure is capable of converting a variation in a magnetic field into an electrical potential difference between two electrical terminals 202, 203. It comprises either of the stacks of layers 100, 101 as described above.

Figure 8:
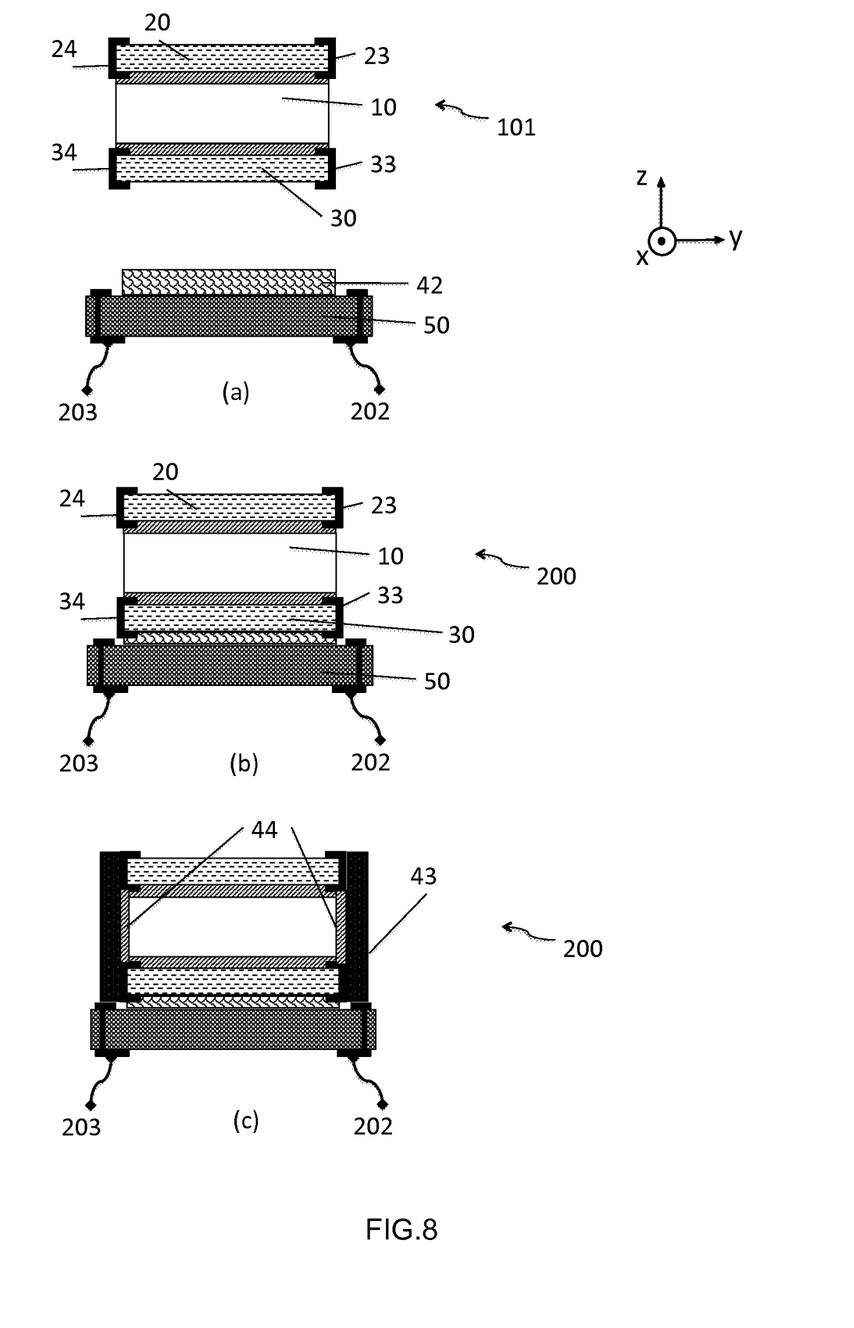
FIGS. 8a to 8c show a method of manufacturing a converter structure according to the disclosure.

As shown in FIGS. 8a to 8c, one electrical terminal 202 is electrically connected to one of the interdigitated electrodes 23, 33; the other electrical terminal 203 is connected to the other of the interdigitated electrodes 24, 34, for example, via a printed circuit layer or carrier layer 50 (e.g., a "printed circuit board" (PCB)). The printed circuit layer 50 may, for example, be assembled by means of a layer of adhesive 42 on the free face of the second layer 20 or third layer 30 of the stack of layers 100, 101 (FIG. 8a). As illustrated in FIG. 8a, the backing layer 50 may comprise electrical terminals 202, 203 on the rear face, with its front face being joined to the stack of layer 100, 101. These electrical terminals 202, 203 can thus be subsequently connected to other elements in order to produce the generator 400.

The electrical connection between the terminals of the interdigitated electrodes 23, 24, 33, 34 and the contacts of the printed circuit layer 50 (capable of being connected to the two electrical terminals which will undergo the potential difference) can be established by means of conductive adhesive strips 43 deposited on the side edge of the converter 200, in particular, on the side edge of the stack of layers 100, 101 and the side edge or edge of the backing layer 50. Side edge signifies the lateral surfaces connecting the main faces of the layers, with the main faces being parallel to the plane (x, y) in the figures. The layer edges correspond to a peripheral portion on a main face. The side edge of the first layer 10 of magnetostrictive material will have been covered beforehand with an adhesive film 44 of electrically insulating material, in particular, in order to prevent the conductive adhesive strips 43 from being in short circuit, in contact with the first layer 10 (FIG. 8c).

Alternatively, the electrical connection between the interdigitated electrodes 23, 24, 33, 34 and the contacts of the backing layer 50 can be made by means of wire bonding. These wire bondings may run from the face of the second (and/or third) layer 20 comprising the electrodes 23, 24 of from its side edge to one of the faces of the backing layer 50 of its side edge.

Alternatively, the electrical connection between the interdigitated electrodes 23, 24, 33, 34 and the contacts of the backing layer 50 can be established by means of conductive vias passing through the stack of layers (100, 101).

The printed circuit layer 50 will advantageously have a shape similar to that of the stack of layers 100, 101, for example, a circular shape. According to one alternative, it can be joined to a second printed circuit comprising functions of switching for collecting the charges generated on the electrodes (23, 24, 33, 34), of storage of the charges and of processing of the induced electrical signal.

According to another advantageous alternative, the printed circuit layer 50 may itself include at least one switch device for collecting the charges generated on the electrodes (23, 24, 33, 34). It may also include at least one storage device for storing the charges generated on the electrodes (23, 24, 33, 34). It may also include at least one processing device for processing the electrical signal induced by the charges generated on the electrodes (23, 24, 33, 34).

According to yet another advantageous alternative, a buffer layer, consisting of at least one material with sound-absorbing properties, is arranged between the stack of layers 100, 101 and the backing layer 50. This buffer layer is joined together, on the one hand with the stack 100, 101 and on the other hand with the backing layer 50, via a layer of adhesive.

In the converter 200, the role of the buffer layer will be to absorb the acoustic waves that can be generated by the sudden change in shape and/or state of stress of the second (and/or third) layer of piezoelectric material 20, 30 that may occur at the time of charge recovery on the terminals of the converter 200 (collection of charges will be dealt with in further detail below during description of the generator). These acoustic waves result in an audible click at each charge recovery, which may be undesirable in some applications. The buffer layer absorbs or at least significantly dampens this sound, thus eliminating or attenuating the undesirable sound.

As a non-limiting example, the buffer layer may comprise a honeycomb material, particularly with open cells. By way of example, a material such as polyurethane foam may be used.

In order to form the electricity generator 400, the magnetoelectric converter 200 can be placed in a housing defined by a magnetic field source 300, in which a magnetic field B prevails, with part of the field lines being included in a reference plane defined by the first layer 10 of magnetostrictive material of the converter 200. A particularly compact generator 400 is thus created. The magnetic field source 300 and the converter 200 can rotate in relation to each other so as to vary the orientation of the magnetic field B in the reference plane.

The converter 200 is thus penetrated by a preferably uniform magnetic field B and oriented in an initial direction $B_0$ in the reference plane (x, y). The variation in this magnetic field is intended to be converted into an electrical potential difference between the two electrical terminals 202, 203 of the converter 200.

Advantageously, the converter will be positioned in the housing of the field source 300 so that the initial field direction $B_0$ is parallel to a preferential axis of deformation (advantageously the main axis 4) of layer 10 of magnetostrictive material.

Figure 9:
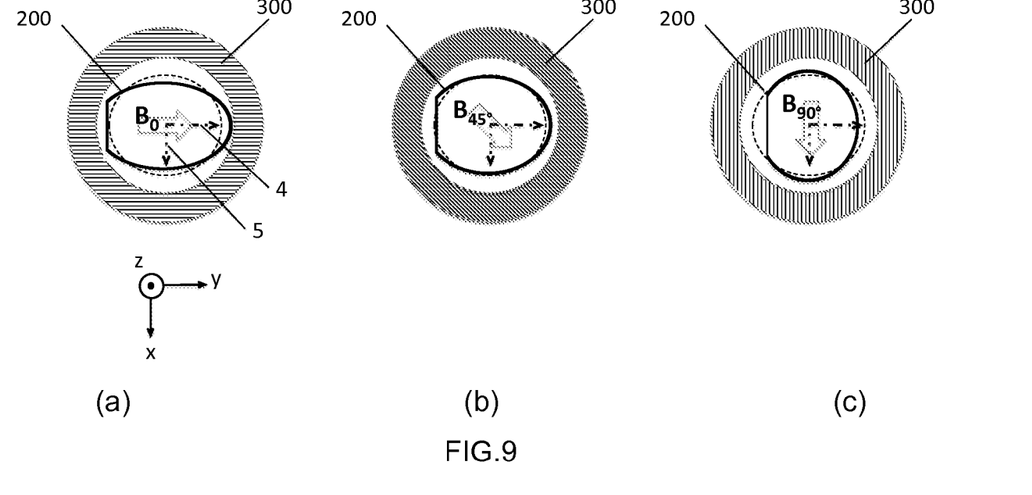
FIGS. 9a to 9c show a block diagram of the operation of a compact electricity generator according to the disclosure.

As shown in FIG. 9a, under the action of the magnetic field $B_0$, the first layer 10 of magnetostrictive material is magnetized and undergoes maximum deformation along the main axis of deformation 4. This deformation corresponds to a maximum extension of the stack of layers 100, 101 in the reference plane along the main axis of deformation 4 and to a maximum contraction (i.e., a negative extension, which will subsequently be designated "minimum extension") in the reference plane (x, y) along the secondary axis 5. The deformation of the first layer 10 is shown schematically in FIG. 9a by the oval-shaped distortion of the converter 200 along the main axis 4. This deformation is applied to the second layer 20 (and, if present, to the third layer 30) and corresponds to an initial state of the converter 200.

In order to vary the magnetic field, its orientation is, for example, rotated clockwise from the initial direction $B_0$ towards a direction $B_{45°}$ (as illustrated in FIG. 9b) by rotating the field source and/or the converter. Consequently, the stack of layers 100, 101 of the converter 200 is transformed from its initial state to a second state in which:

the first layer will shrink along the main axis of deformation 4, from maximum extension to a lesser average extension, owing to the reduction in the component of the magnetic field B along the main axis of deformation 4;

the first layer will furthermore stretch along the secondary axis of deformation 5, from minimum extension (maximum contraction) to a greater average extension.

The variation in the magnetic field (by a rotation in its direction) thus induces variations in the deformation of the first layer 10. The latter transmits these variations to the second 20 (and potentially third 30) layer(s), joined to the first layer 10 in the stack of layers 100, 101.

If one continues to rotate the orientation of the magnetic field from the direction $B_{45°}$ toward direction $B_{90°}$, in the clockwise direction (as illustrated in FIG. 9c), the stack of layers 100, 101 will be transformed from the second state to a third state in which:

the first layer still shrinks along the main axis 4, from an average extension to minimum extension (maximum shrinkage);

the first layer stretches along the secondary axis 5, from an average extension to maximum extension along the secondary axis 5, taking account of the alignment of the magnetic field with this axis 5.

The variation in the magnetic field B between the initial position and the third position has, therefore, caused variations in deformation of the first layer 10, transmitted to the second 20 (and potentially the third 30) layer. The second 20 and third 30 layers of piezoelectric material function in $d_{33}$ mode, i.e., the polarization axis is in the plane of the layer and, therefore, generation of charges in the material is sensitive to the deformations in this same plane.

In the case of the converter 200 according to an advantageous configuration of the disclosure, the first 21 and second 31 polarization axis of the second 20 and third 30 layers of piezoelectric material are finely aligned (better than 15°) with the main axis of deformation 4 of the first layer 10. In this manner, the second 20 and third 30 layers undergo, along their polarization axis 21, 31, between the initial state and the third state, maximum deformation from a maximum extension to a minimum extension (maximum shrinkage). A maximum quantity of charges (e.g., negative charges) can, therefore, be accumulated on one of the interdigitated electrodes (e.g., 23, 33) and be collected at one of the electrical terminals 202, 203 of the generator, on a capacitive device for instance.

This first sequence of variation in the magnetic field (from $B_0$ to $B_{90°}$), transforming the converter 200 from the initial state to the third state, can thus generate an electrical potential difference between the electrical terminals 202, 203. This potential difference is at a maximum owing to the configuration of the converter 200 according to the disclosure, ensuring good efficiency of the converter 200 in a compact configuration of an electricity generator 400.

Following collection of the charges in the third state, the potential difference between the electrical terminals 202, 203 is zero and the structure of the converter 200 is in a fourth state considered a new initial state. The variation in the magnetic field (from $B_{90°}$ to $B_{180°}$ in the clockwise direction) will transform the state of layers 100, 101 from a fourth initial state to a fifth state in which:

the first layer stretches along the main axis 4, from a minimum extension to a maximum extension, given the alignment of the field with the main axis of deformation 4; and the first layer shrinks along the secondary axis 5, from a maximum extension to minimum extension (maximum shrinkage).

The second 20 (and if present, the third 30) layer undergoes a maximum deformation along its polarization axis 21, 31, between the fourth initial state and the fifth state, from a state of minimum extension to a state of maximum extension. A maximum quantity of charges (for example, positive charges) can, therefore, be accumulated on the other of the interdigitated electrodes 24, 34 and be collected at one of the electrical terminals 202, 203 of the generator.

The disclosure thus proposes an electricity generator 400 that is compact, including an efficient magnetoelectric converter 200, obtained in a configuration involving a weak magnetic field not saturating the anisotropic magnetostrictive material.

The electricity generator 400 according to the disclosure also has the advantage of improved robustness and reliability. Indeed, the converter 200, subjected to repeated deformation cycles during wear and reliability tests, has in some cases demonstrated improved mechanical resistance compared to a converter for which the first layer of magnetostrictive material works in a magnetic saturation mode. In a magnetic saturation configuration, the stack of magnetostrictive/piezoelectric layers may sometimes reach the limit of mechanical breakage after a given number of deformation cycles, $1^E6$, for example. By way of comparison, longevity in terms of deformation cycles of the converters 200 according to the disclosure can be increased by a factor of 10 to 1000. Furthermore, the weakness of the magnetic field limits the amplitude of the parasitic torque applied to the converter tending to place the preferential axis of deformation of the layer of magnetostrictive material in the alignment of the field.

According to an exemplary embodiment of the disclosure, layers 10 of crystalline Terfenol-D are manufactured from a bar 1 of longitudinal axis <112>. The layers 10 are, for instance, 1 mm thick and 2 cm in diameter.

As described in detail above, the crystallographic directions <111> and <110> corresponding to the preferential axis of magnetization 4, 5 are not marked directly on the bar 1, since the orientation of these axis varies within a same bar 1. The treatment of the layer 10 of magnetostrictive material according to the disclosure is subsequently implemented. The treatment allows identification, for each layer 10, of the preferential axis of magnetization 4, 5 and according to a form of embodiment, formation of a mark 12 for their identification. Following this process, the layers 10 comprise, for example, a notch 12 (hereinafter known as the first notch) on their side edges, extending from one face to the other, a few hundred microns in depth. The notch 12 is located in the direction of the main axis of magnetization 4 of each layer 10. Alternatively, the notch 12 can be replaced with a flat or indeed a line or engraving on a surface of the layers 10.

The stack of layers 101 is subsequently formed by assembling a second layer 20 and a third layer 30 of PZT.

Each layer of PZT has a thickness of, for example, 100 microns and a diameter of 2 cm. In this exemplary embodiment, each second 20 and third 30 layer has interdigitated electrodes 23, 24, 33, 34 on each of its faces.

Such a configuration encourages efficiency in generating charges in response to deformation. These electrodes come in the form of combs; the fingers of the combs are perpendicular to the polarization axis of the material. The polarization axis 21, 31 of the second 20 and third 30 layers, respectively, can be marked by a second 22 and a third 32 notch on the second 20 and third 30 layer of PZT, respectively. A film of electrically non-conductive adhesive 40 is applied to the face of the second layer 20 to be assembled, and the first layer 10 is placed adjacent to the second layer in an opposing position thereto. The alignment between the first notch 12 and the second notch 22 is performed using an apparatus allowing micrometric movements. Pressure is subsequently applied to bring the first 10 and second 20 layers into contact and spread the film of adhesive 40 uniformly at the interface. The alignment accuracy results in misalignment between the main axis of deformation 4 and the first polarization axis 21 (of the second layer) of less than 15°. The stack of layers 100 is formed in this manner.

An electrically non-conductive film of adhesive 41 is subsequently applied to the face of the third layer 30 to be joined, and the stack of layers 100 is placed adjacent to the third layer 30. The free face of the first layer 10 is positioned adjacent to the glued face of the third layer 30 in an opposing position thereto. The alignment between the first 12 (or the second 22) notch and the third notch 32 is carried out using the same apparatus as before. Pressure is subsequently applied to bring the faces to be glued into contact and spread the film of adhesive uniformly at the interface. The alignment accuracy results in alignment between the main axis of deformation 4 and the second polarization axis 31 (of the third layer) better than to within 15°.

A layer of printed circuit 50, 2 cm in diameter and a few hundred microns thick, is subsequently glued (layer of adhesive 42) on one of its faces to be joined to the free face, for example, of the third layer 30.

A film of adhesive 44 or other electrically non-conductive material is applied to protect and insulate the side edge of the first layer 10 of Terfenol. Strips of conductive material 43 (conductive adhesive, for example) are subsequently applied in order to electrically connect the electrical terminals 202, 203 of the printed circuit layer 50 and the interdigitated electrodes 23, 24, 33, 34 of the two layers 20, 30 of PZT.

The magnetoelectric converter 200 can subsequently generate an electrical potential difference between the electrical terminals 202, 203, by applying variations in the magnetic field B, for example, by using a rotating-direction field. The electricity generator 400 preferably comprises a magnetic field source 300 defining a housing within which a magnetic field prevails. The magnetoelectric converter is arranged in this housing, surrounded by the magnetic field. A relative rotational movement between the converter 200 and the magnetic field source 300 generates variation in the field.

Terfenol-D is advantageously used as the material in the first layer 10 of the converter 200, since it has two preferential axis of deformation 4, 5 in the reference plane (x, y): implementation of the electricity generator 400 according to the disclosure is, therefore, highly favorable in the case of charge collection sequences following quarter turns.

Anisotropic magnetostrictive materials with a single preferential axis of deformation in the reference plane may also be used.

The disclosure is not limited to the described embodiments and alternative embodiments can be provided without departing from the context of the invention as defined by the claims.

The invention claimed is:

1. An electrical generator, comprising:
a converter comprising two electrical terminals, the converter capable of converting a variation in a magnetic field into an electrical potential difference between the two electrical terminals and including a stack of layers including a first layer of anisotropic magnetostrictive material defining a reference plane and a second layer of a piezoelectric material, the first layer having at least one preferential axis of deformation in the reference plane, the second layer having a polarization axis in the plane defined by the second layer, parallel to the reference plane, the preferential axis of deformation of the first layer being aligned to within 15° with the polarization axis of the second layer; and
a source generating the magnetic field in the reference plane;
wherein the magnetic field source and the converter can rotate in relation to each other so as to vary an orientation of the magnetic field in the reference plane, and the strength of the magnetic field is insufficient to magnetically saturate the anisotropic magnetostrictive material of the first layer.

2. The electrical generator of claim 1, wherein the magnetic field source defines a housing in which the magnetic field is present, the converter being located in the housing.

3. The electrical generator of claim 1, wherein the magnetic field source is a Halbach cylinder.

4. A layer of anisotropic magnetostrictive material, comprising at least one preferential axis of deformation in a plane defined by the layer and at least one mark identifying a preferential axis of deformation.

5. The layer of anisotropic magnetostrictive material of claim 4, wherein the mark is a flat surface or a notch on one edge of the layer, or an engraving on one face of the layer.

6. The layer of anisotropic magnetostrictive material of claim 4, further comprising two preferential axis of deformation including a main axis and a secondary axis, wherein the mark identifies the main axis.

7. A stack of layers, comprising:
a first layer of a magnetostrictive material having at least one preferential axis of deformation in a plane defined by the first layer and at least one mark identifying a preferential axis of deformation; and
a second layer of a piezoelectric material having a first polarization axis in a plane defined by the second layer parallel to the plane defined by the first layer, wherein the first polarization axis is identified by a second mark; and
wherein the first polarization axis and the preferential axis of deformation are aligned to within 15°.

8. The stack of layers of claim 7, further comprising a bonding layer between the first layer and the second layer.

9. The stack of layers of claim 7, wherein the second layer comprises metal electrodes on at least one of its faces or on its side edge.

10. The stack of layers of claim 7, wherein the polarization axis and the preferential axis of deformation are aligned to within 5°.

11. The stack of layers of claim 7, further comprising a third layer of a piezoelectric material having a second polarization axis in a plane defined by the third layer, wherein the first layer is disposed between the second layer and the third layer, and wherein the second polarization axis and the preferential axis of deformation are aligned to within 15°.

12. The stack of layers of claim 11, wherein:
the first layer of a magnetostrictive material comprises a main axis of deformation and a secondary axis of deformation in the plane defined by the first layer;
the first polarization axis of the second layer of a piezoelectric material is aligned to within 15° with the main axis of deformation; and
the second polarization axis of the third layer of a piezoelectric material is aligned to within 15° with the secondary axis of deformation.

13. The stack of layers of claim 7, wherein the piezoelectric material comprises PZT, PMN-PT, PVDF, BaTiO$_3$ or AlN.

14. The stack of layers of claim 7, wherein the magnetostrictive material comprises Terfenol-D, Galfenol, Terbium Iron or Iron-Cobalt.

15. A converter capable of converting a variation in a magnetic field into an electrical potential difference between two electrical terminals and including a stack of layers according to claim 7.

16. The converter of claim 15, further comprising a printed circuit layer assembled with the stack of layers, the printed circuit layer connecting the at least one layer of piezoelectric material of the stack to both electrical terminals.

17. The converter of claim 16, further comprising a buffer layer comprising a material having sound absorbing properties, the buffer layer located between the stack and the printed circuit layer.

* * * * *